United States Patent [19]

Lazarus et al.

[11] Patent Number: 4,792,767
[45] Date of Patent: Dec. 20, 1988

[54] PHASE AND FREQUENCY DETECTOR AND USE OF THIS DETECTOR IN A PHASE-LOCK LOOP

[75] Inventors: Michel Lazarus, Gif sur Yvette; Michel Frances, Massy, both of France

[73] Assignee: Thomson-CSF, Paris, France

[21] Appl. No.: 43,465

[22] Filed: Apr. 28, 1987

[30] Foreign Application Priority Data

May 13, 1986 [FR] France ............... 86 06860

[51] Int. Cl.⁴ .................. H03L 7/00; H03L 7/06; H03K 5/26
[52] U.S. Cl. .................... 331/1 A; 331/25; 331/DIG. 2; 328/134; 328/155; 307/516
[58] Field of Search ........... 331/1 A, 25, 27, DIG. 2; 307/510, 514, 516; 328/133, 134, 155

[56] References Cited

U.S. PATENT DOCUMENTS 4,277,754 7/1981 Minakuchi .................... 328/133
4,473,805 9/1984 Guhn .................... 331/DIG. 2 X
4,500,852 2/1985 Phillips .................... 331/12

FOREIGN PATENT DOCUMENTS 2162602 7/1973 France .
1462408 7/1974 United Kingdom .

Primary Examiner—Eugene R. Laroche
Assistant Examiner—David Mis
Attorney, Agent, or Firm—Marmorek, Guttman & Rubenstein

[57] ABSTRACT

This phase and frequency detector, receiving two logic input signals R and V, comprises a set of $2k+2$ memory cells, cascade arranged and linked in twos by $2K+1$ control cells, capable especially of transferring the information contained in the changes of state of the signals R and V, from the end memory cells to which they are respectively applied, and by each of the directions respectively, to a memory cell $MU_n$ or $MD_n$ (depending on whether the signal R is ahead or delayed with respect to the signal V), this cell then giving square waves the duty factor of which is proportionate to the instantaneous phase shift $\Delta\phi$ between the signals R and V, when $(2\pi-1)n < |\Delta\phi| < \pi$.

11 Claims, 8 Drawing Sheets

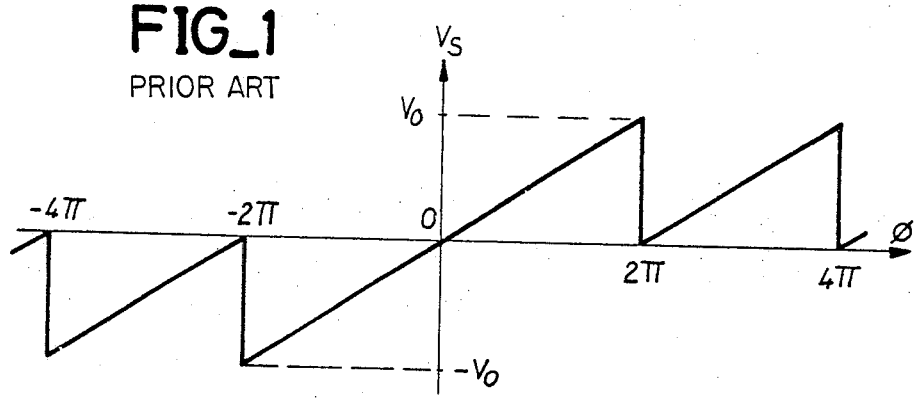
FIG_1 PRIOR ART
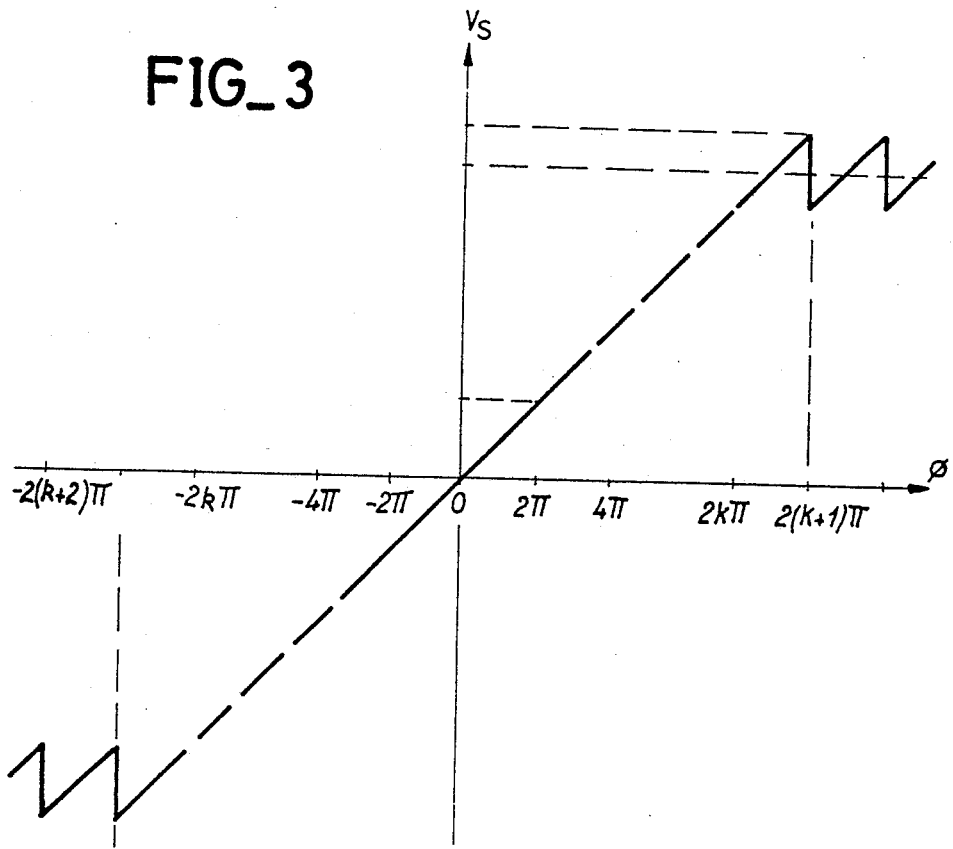
FIG_3

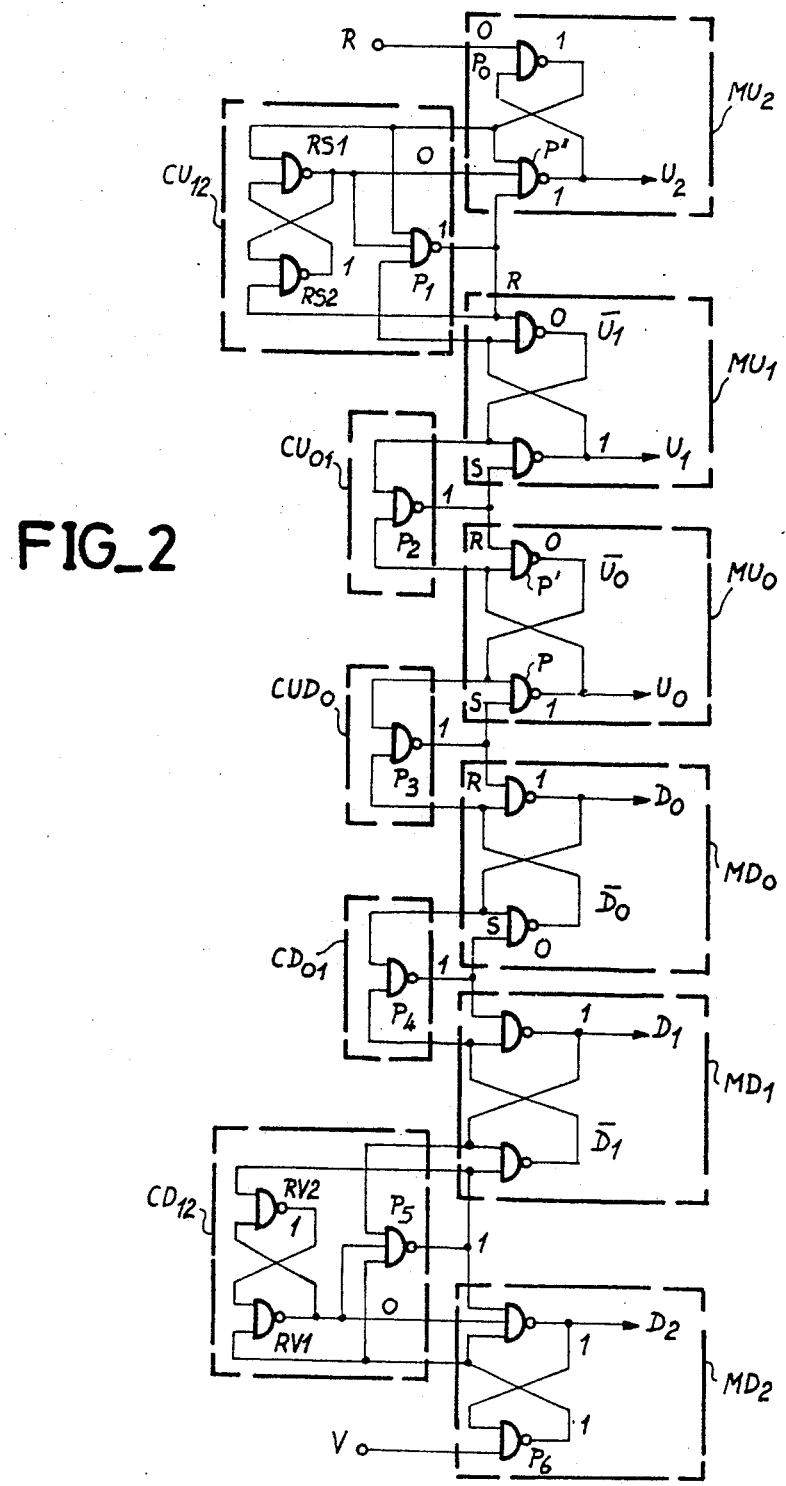
FIG_2

FIG_4-a
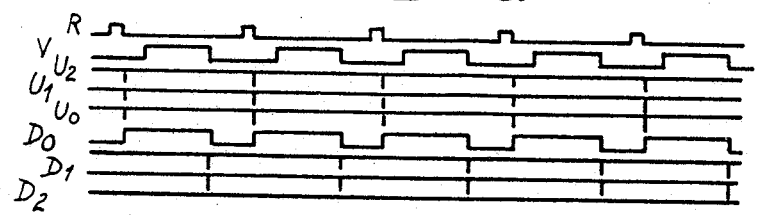
FIG_4-b
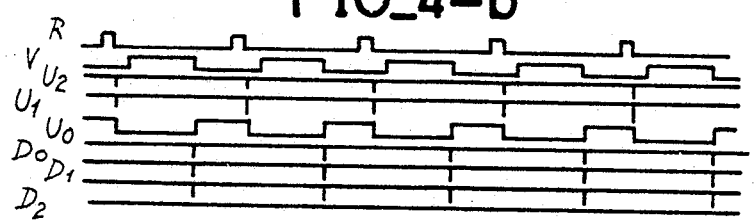
FIG_4-c
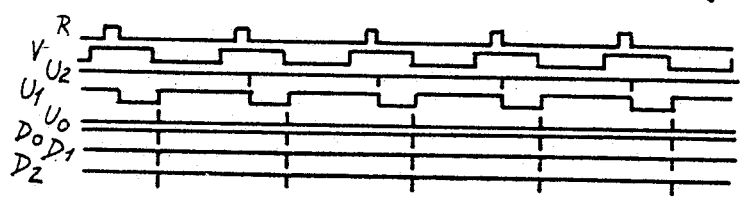
FIG_4-d
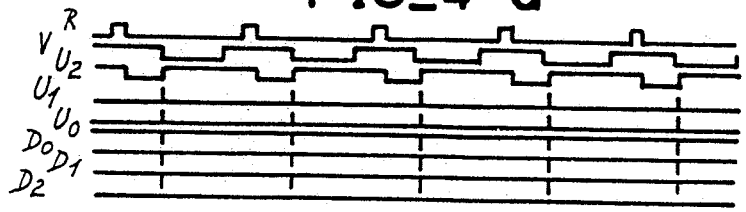
FIG_4-e
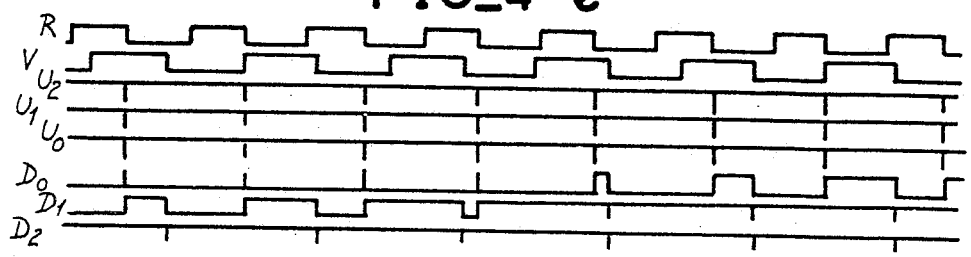

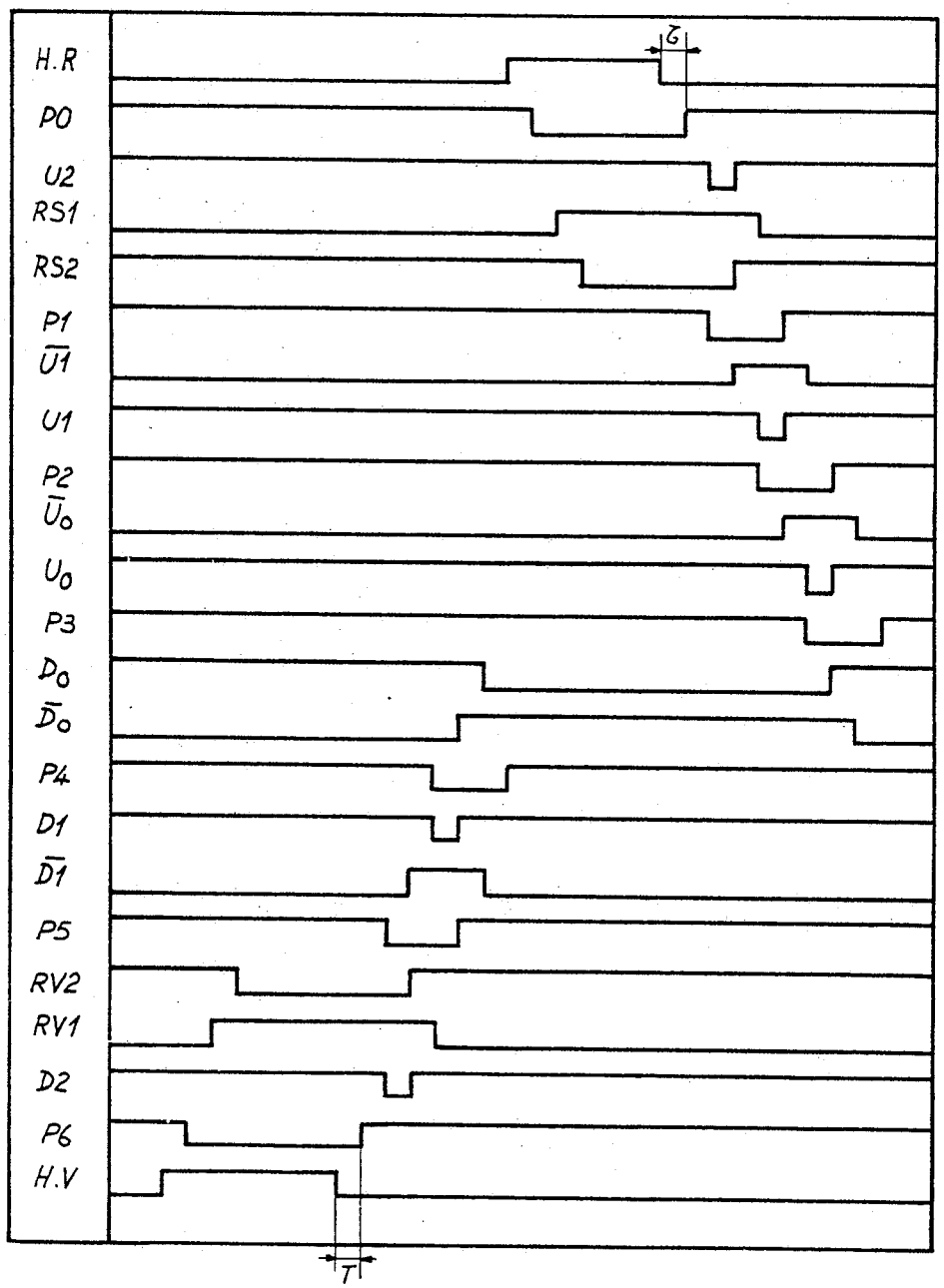
FIG_5

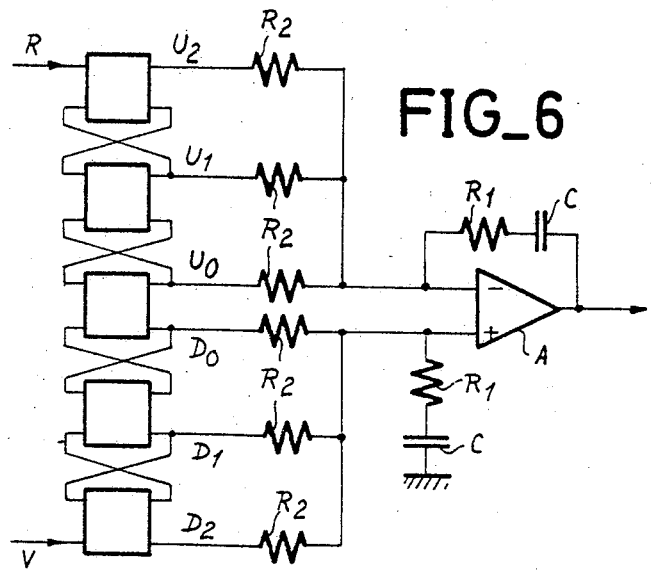
FIG_6
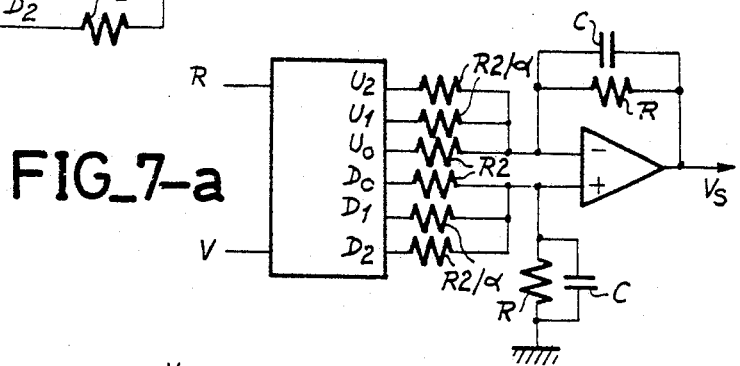
FIG_7-a
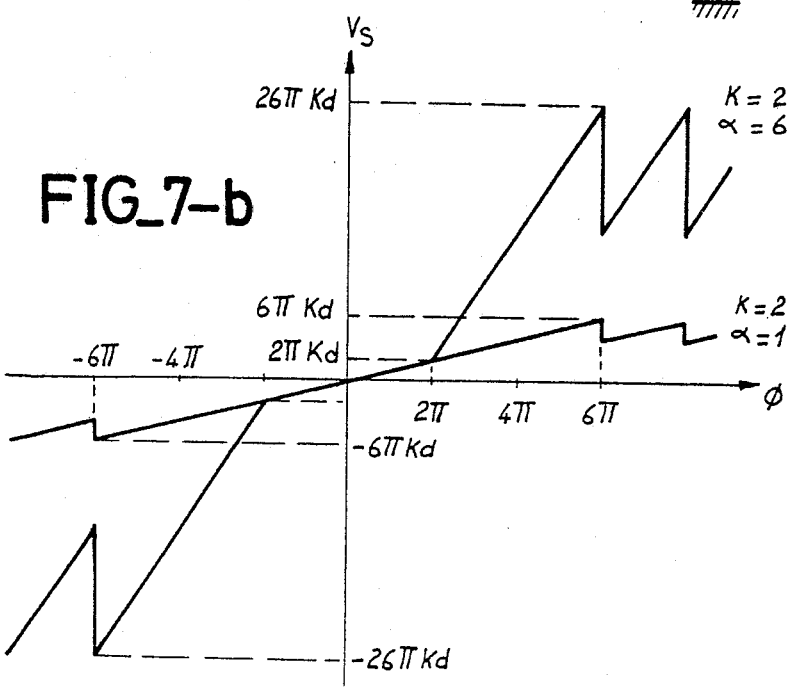
FIG_7-b

FIG_8-a
PRIOR ART
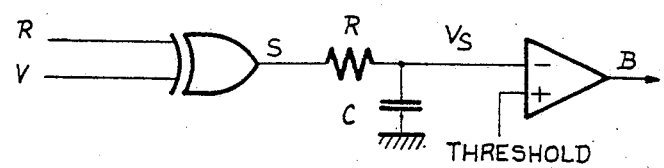
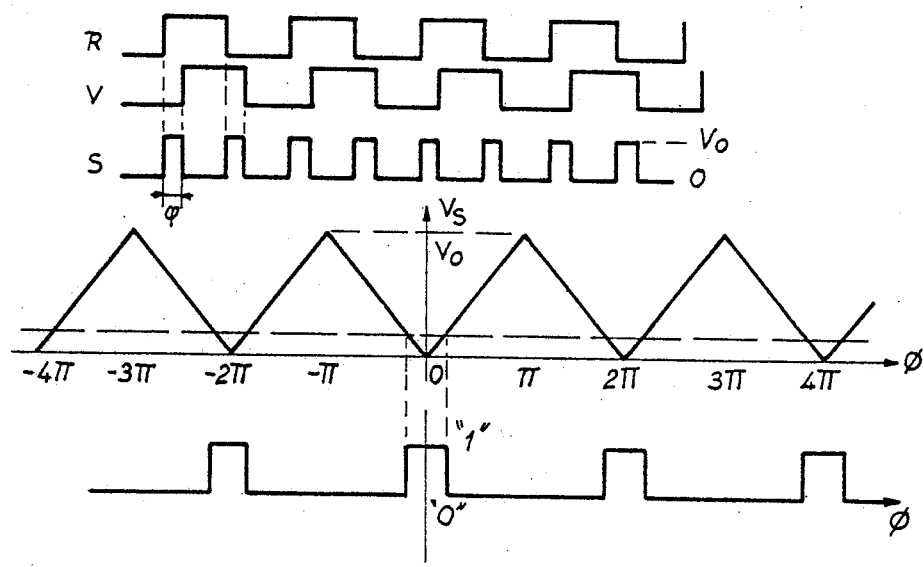
FIG_8-b

FIG_9-a
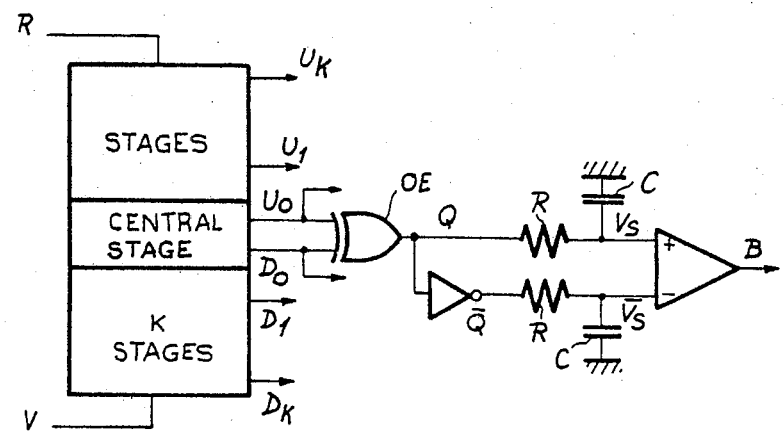
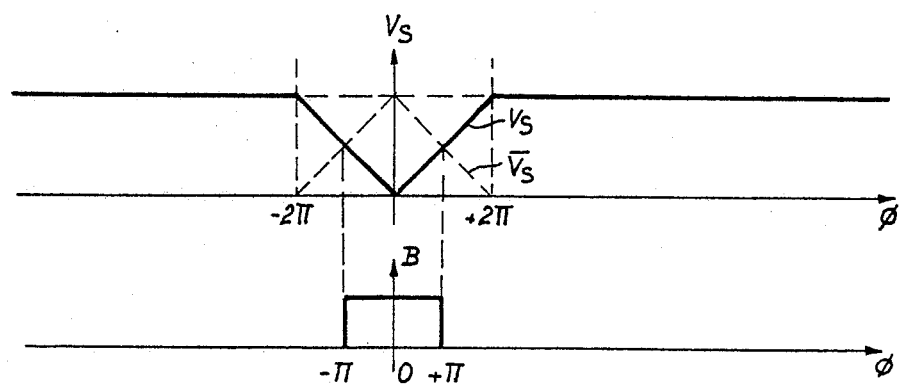
FIG_9-b

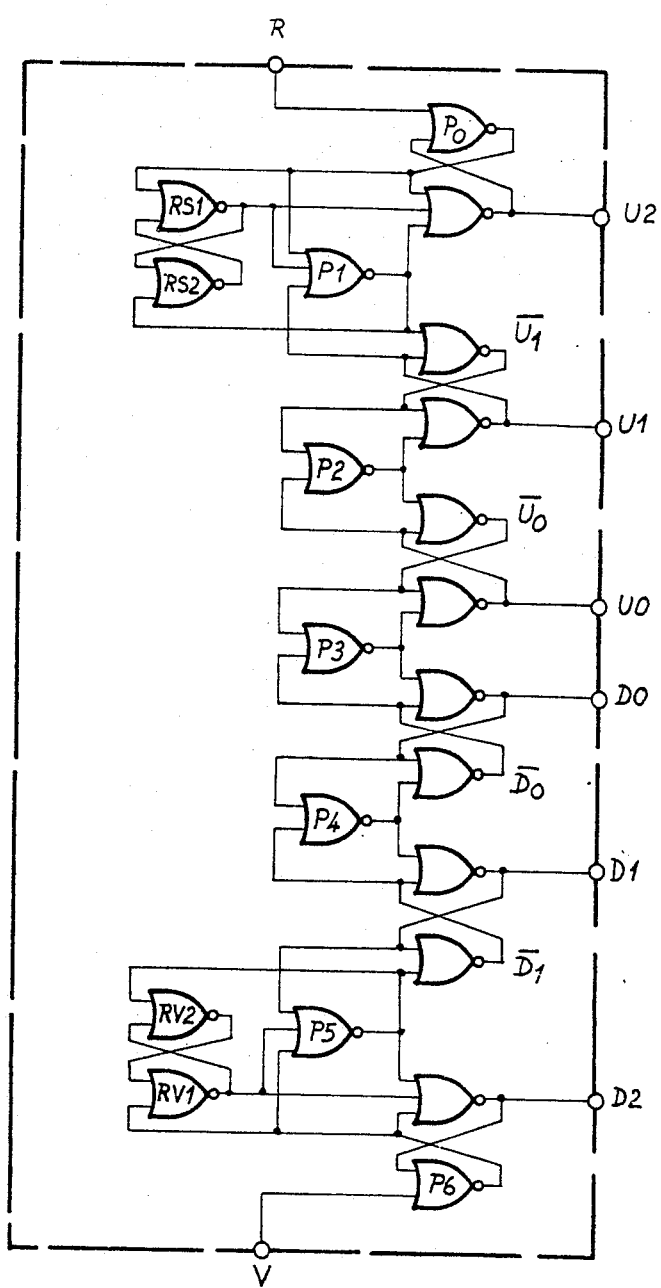
FIG_10

PHASE AND FREQUENCY DETECTOR AND USE OF THIS DETECTOR IN A PHASE-LOCK LOOP

BACKGROUND OF THE INVENTION

1. Field of the Invention

The present invention pertains to a phase and frequency detector which can be used in frequency-synthesizing in general, and especially in frequency-generating circuits radars.

2. Description of the Prior Art

In frequency synthesizers in general, and in phase-lock loops, the element that detects the phase and frequency error is a logic device. In the current state of the art, phase and frequency detectors are of the type known under the reference MC 4344 (TTL technology) or MC 12040 (ECL technology from MOTOROLA) or again, 54 HC 4046 (CMOS or HCMOS technology) from NATIONAL SEMI-CONDUCTOR.

The principle of all these detectors is identical, and they have the same sequence chart which can be seen in FIG. 1 which depicts the analog signal $VS=f(\phi)$, obtained after decoding and filtering of the output logic signals from the logic device.

This phase characteristic $VS=f(\phi)$ is linear from $-Vo$ to $+Vo$ when the relative phase shift of the input signals R and V of the detector ranges between $-2\pi$ and $+2\pi$.

When the relative phase shift is greater than $2\pi$, a phase-lock loop using a detector of this type is broken off but, nonetheless, the detector gives saw-toothed signals at a frequency equal to the difference between the input frequencies $FR-FV$, for which the mean value by the loop filter is $\pm Vo/2$ according to the sign of the frequency difference. Thus the loop is frequency-aligned with a slope $dF/dt = w_n^2/2$ where $w_n$ is the inherent locking angular frequency.

In a phase loop with an inherent angular frequency of $w_n$ and with a switch-off angular frequency of $w_c$ using a detector of this type, if the reference frequency (R) is made to vary in steps of "$\Delta F$", the loop remains locked on in phase, at a range equal to its capturing band $w_c$, and if $\Delta F > w_c$, the loop is frequency-aligned with a slope equal to $w_n^2$ up to a frequency equal to $FR-w_c$ where it is phase-locked. The total frequency-alignment time is therefore all the greater as $w_n$ and $w_c$ are small, which is often the case, especially for reasons of spectral purity where band of the loop $w_c$ is deliberately limited.

Should variation of the input frequency no longer stepwise but linear, the maximum slope that the loop can follow while remaining phase-locked is $dF/dt_{max} = w_n^2$.

3. Summary of the Invention

The phase and frequency detector, which is the object of the present invention, can be used to deliver, after decoding and filtering, a linear voltage of the differential phase of the inputs not at $\pm 2\pi$ but in a range of $\pm 2(K+1)\pi$, it being possible for K to be as great as possible without any loss of frequency performance frequency for a given technology.

With a detector of this type, since the phase error is no longer limited to $\pm 2\pi$ but to $\pm 2(K+1)\pi$, the phase-lock loop remains locked in phase at a frequency level $(K+1)w_c$ and if the frequency level $\Delta F$ is greater than $(K+1)w_c$, the frequency-alignment slope becomes $(2K+1)w_n^2/2$, without modifying the pass band of the locking in.

In particular, it can be seen that if it is sought to keep the phase loop locked in phase at a frequency level $\Delta F$, it is enough for the factor K to have a value of $k > \Delta F/w_c - 1$.

In the same way, the maximum slope that the loop can support while remaining locked in phase is $dF/dt_{max} = (K+1)w_n^2$.

Furthermore, should the pass band of the phase loop be deliberately low, it is possible to assign, to the outputs of the stages with the rank $K > 1$, a gain $\alpha$ which is also greater than 1, leading to an even greater range of performances.

The detector, which is the object of the invention, can thus be used to give low pass band phase loops very great agility, without greatly penalizing the noise performances or input frequency performances.

Depending on the analog decoding selected, a detector of this type can be applied to all existing phase loops, by multiplying their dynamic performances by an extremely high coefficient.

According to the invention, a phase and frequency detector, receiving two logic input signals, R and V, essentially comprises a set of $2k+2$ memory cells ($MU_k$ to $MU_0$, and $MD_0$ to $MD_k$) which are cascade connected and linked in twos by $2k-1$ control cells ($CUD_0$, $CU_{01}$ to $CU_{k-1,k}$, $CD_{01}$ to $CD_{k-1,k}$) capable firstly, of transferring the information, contained in the changes of state of the signals R and V, from the end memory cells ($MU_k$, $MD_k$) to which they are respectively applied, and by each direction respectively, up to a memory cell $MU_n$ or $MD_n$ (depending on whether the signal R is in advance or is delayed with respect to the signal V), this memory cell then providing square waves, the duty factor of which is proportionate to the instantaneous phase shift $\Delta\phi$ between the signals R and V, when $(2\pi-1)n < |\Delta\phi| < 2n\pi$, and secondly, of keeping the memory cells $MU_{n+1}$ to $MU_k$ and $MD_0$ to $MD_k$ in their initial logic state, and cells $MU_0$ to $MU_{n-1}$ in an opposite logic state, or memory cells $MD_{n+1}$ to $MD_k$ and $MU_0$ to $MU_k$ in their initial logic state, and cells $MD_0$ to $MD_{n-1}$ in an opposite logic state depending on whether the signal R is ahead or delayed with respect to the signal V.

BRIEF DESCRIPTION OF THE DRAWINGS

Other objects and features of the present invention will appear more clearly from the following description of a mode of embodiment, made with reference to the appended figures, of which, in addition the FIG. 1 which pertains to the prior art:

FIG. 2 is a diagram of a mode of embodiment of a phase and frequency detector according to the invention, without any associated decoding and filtering circuit;

FIG. 3 depicts the characteristic signal $V_S=f(\phi)$ delivered, after filtering, by a phase and frequency detector according to the invention FIGS. 4a, 4b, 4c, 4d and 4e are timing diagrams which illustrate the working of the diagram of FIG. 2;

FIG. 5 is also a timing diagram which illustrates the working of the diagram of FIG. 2;

FIG. 6 depicts a special decoding and filtering circuit associated with the circuit of FIG. 2 and enabling it to be used to its utmost possibilities;

FIG. 7a depicts another decoding circuit which can be used to increase the dynamic performance of a phase-lock loop that uses a detector according to the invention;

FIG. 7b depicts the characteristic signal $V_S = f(\phi)$ obtained with a decoding circuit of this type;

FIG. 8a is a diagram of a phase loop locking detector circuit according to the prior art;

FIG. 8b is a timing diagram pertaining to the operation of the diagram of the FIG. 7a;

FIG. 9a is a diagram of a special phase loop locking detector circuit, associated with a phase and frequency detector according to the invention;

FIG. 9b is a timing diagram pertaining to the operation of the diagram of FIG. 8a;

FIG. 10 depicts an alternative mode of embodiment of a detector according to the invention.

DESCRIPTION OF THE PREFERRED EMBODIMENT

The phase and frequency detector, which is the object of the present invention, is depicted in FIG. 2. This device can be used to deliver, after decoding and filtering, a linear voltage $V_S$ of the differential phase of the input signals in a range $\pm 2(K+1)\pi$ with, for example, $K=2$.

This device is formed by the cascade-setting of $2K+2$ (i.e. 6, in this case) memory cells $MU_2$, $MU_1$, $MU_0$, $MD_0$, $MD_1$, $MD_2$, linked in twos by $2K+1$ (i.e. 5 in this case) control cells $CU_{12}$, $CU_{01}$, $CUD_0$, $CD_{01}$, $CD_{02}$. The end memory cells $MU_2$ and $MD_2$ receive the digital input signals R and V respectively. This device can be broken down into two symmetrical parts which play an analog role depending on whether the signal R is ahead of or behind in phase with respect to the signal V. Each of these two symmetrical parts comprises $K+1$ memory cells and K control cells respectively bearing the references U and D, with the central control cell $CUD_0$ setting up the link between these two parts.

Each memory cell comprises a logic flip-flop of the RS type, made up of 2 re-looped logic gates of the NAND type, such as P and P' for the memory cell $MU_0$, with the gate P giving a logic signal $U_0$ and the GATE P' an additional signal $\overline{U_0}$.

The control cells are of three types the central control cell ($CUD_0$), the two end control cells ($CU_{12}$ and $CD_{12}$ in the chosen example corresponding to $K=2$) and the intermediate control cells (of which there are 2 in the example under consideration: $CU_{01}$ and $CD_{01}$).

The intermediate control cells comprise a logic gate of the NAND type which receives, firstly, the complementary signal from the memory cell which precedes it (in the direction in which the information is transmitted from one end of the device to its centre) and secondly, the non-complementary signal of the memory cell which follows it (in the direction considered).

Since each memory cell is fitted with two inputs R and S, the output of this NAND gate is, furthermore, linked to the input R of the following memory cell and to the input S of the preceding memory cell, thus making it possible, when the conditions are created for a change in the state of the output of this NAND gate, to transfer information from the preceding memory cell to the following memory cell while, at the same time, resetting the preceding memory cell in its initial state, this memory cell then transmitting only the information that has caused the change of state.

Thus the intermediate control cell $CU_{01}$ consists of a NAND gate $P_2$ which receives, firstly, the signal $\overline{U_1}$ and secondly, the signal $U_0$, the output of which is applied both to the input R of the following memory cell $MU_0$ and the input S of the preceding memory cell $MU_1$.

The central control CUD consists of a NAND gate $P_3$ which receives, firstly, the signal $\overline{U_0}$ and secondly $\overline{D_0}$, the output of which is applied both to the input R of the memory cell $MD_0$ and the input S of the memory cell $MU_0$. Thus when the conditions are created for a change in the state of this NAND gate $P_3$, the information can pass from a central memory cell ($MU_0$ or $MD_0$) to the other memory cell while, at the same time, resetting the first central memory cell in its initial state which thus only transmits the information that has caused this change in state.

Owing to the fact that two complementary signals such as $\overline{U_1}$ and $U_0$ are applied to the input of the intermediate control cells such as $CU_{01}$, there is only one condition for the transfer of information from one memory cell to the following one through the intermediate control cell which links them, and this condition is the appearance of this information.

By contrast, owing to the fact that the input signals of the central control cell are signals of the same nature $\overline{U_0}$ and $\overline{D_0}$, there are two conditions for the transfer of information from one of the central memory cells $MU_0$ or $MD_0$ (called the first cell) to the other cell (called the second cell), i.e. from one part of the diagram (transmitting the active edges of the signal R) towards the other part (transmitting the active edges of the signal V) by means of the central control cell which links them. These two conditions are a prerequisite change in the state of the first central memory cell (due to the transmission, through the corresponding part of the assembly, of an active edge of the corresponding input signal, which is ahead in phase with respect to the other), followed by a change in the state of the second central memory cell (due to the transmission, through the corresponding part of the assembly, of an active edge of the corresponding input signal, delayed in phase with respect to the other). At the output of this first central memory cell, there are then square waves for which the duty factor is proportionate to the phase shift $\Delta \phi$ between the input signals R and V.

This is true only on condition that this phase shift $\Delta \phi$ ranges between 0 and $2\pi$.

For, if this phase shift is greater than $2\pi$, for example if the signals R and V have different frequencies, the device starts working as previously, and then, since the phase shift between these two signals varies gradually from one edge to the other of these signals, there comes a time when, assuming for example that the signal V is in advance of the signal R, two active edges of the signal V succeed one another without any action by an active edge of the R signal. This means that, at the second active edge of the signal V, since the central control cell has previously had one of its inputs change its state at the first active edge of the signal, V will behave like an intermediate control cell and it is then the control cell $CD_{01}$ which will act as the central control cell. Then, it is no longer the longer the memory cell $MD_0$ which delivers the square waves with a duty factor proportionate to the instantaneous phase shift $\Delta \phi$ between the signals R and V, but the memory cell $MD_1$ and so on, as and when this instantaneous phase shift progresses.

Assuming that the phase difference between the signals R and V ranges between $9n\pi$ and $(2n+1)\pi$, the last memory cell to deliver square waves with a duty factor proportionate to the instantaneous phase shift $\Delta \phi$ between the signals R and V consist in the cell $MD_n$ (still assuming that the signal V is in advance of the signal R).

Because the cells $MD_0$ to $MD_{n-1}$ have not been reset in their initial state, the outputs $D_0$ to $D_{n-1}$ are in a logic state opposite to that of the outputs $D_{n+1}$ to $D_k$ of the cells $MD_{n+1}$ to $MD_k$ as well as that of the output $U_0$ to $U_n$ of the cells $MU_0$ to $MU_k$. The output $D_n$ of the cell $MD_n$ delivers, for its part, as we have seen, square waves depicting the instantaneous phase shift $\Delta\phi$ between the signals R and V. Thus, by performing an analog summation and by filtering the signals at the output of all the memory cells, a characteristic signal $V_S=f(\phi)$ is obtained such as the one depicted in FIG. 3, i.e. a characteristic signal which displays the specific quality of being linear between $-2(k+1)\pi$ and $+2(k+1)\pi$.

The functioning of the detector of the invention, depicted in the FIG. 1, appears in the timing diagrams of the FIGS. 4a, 4b, 4c and 4e which respectively correspond to the case where $-2\pi<\Delta\phi<0$, $0<\Delta\phi<2\pi$, $2\pi<\Delta\phi<4\pi$ and $\Delta\phi>4\pi$, the square waves with a duty factor representative of $\Delta\phi$ being then obtained at the output $D_0$, the output $U_0$, the output $U_1$, and the output $U_2$ respectively.

Unlike these timing diagrams, which are "instantaneous" timing diagrams, the timing diagram of FIG. 4e depicts the development of the various signals when $\Delta\phi$ varies linearly from $-4\pi$ to 0.

FIG. 5 depicts an "expanded" timing diagram which is attached only to a square wave of signals R and V, but making the transmit time E of the various logic gates play a role.

This timing diagram is also more complete than the preceding ones inasmuch as it depicts the output signal of each of the logic gates of the diagram of FIG. 1.

The diagram of FIG. 2 also mentions the initial conditions, i.e. the logic states that initially exist at the various points of this diagram. It will be noted that the initial conditions applied to the inputs of the NAND gate $P_3$ (central control cell) are 00 while the initial conditions applied to the inputs of the other control cells are 01, the level 0 being applied to that one of the two inputs which can receive the information in the direction in which this information is propagated, i.e. at the upper input for the upper part of the diagram, and at the lower input for the lower part of the diagram.

We shall now describe the end control cells in greater detail. These end control cells have two functions: one function which is identical to that of the intermediate control cells as described previously, and one function for forming the logic input signals R and V.

For the signals R and V may have any duty factor. Now, the angular frequencies transmitted through the device of FIG. 2 must be very brief.

These end control cells can be used to make angular frequencies of this type from the signals R and V.

Thus the cell $CU_{12}$ comprises a NAND gate $P_1$ with 3 inputs:

A first input which receives the output signal of a NAND gate $P_0$ (located in the end memory cell $MU_2$) which itself receives the signal $U_2$ and R;

A second input which receives the output signal from a "RS" flip-flop formed of two NAND gates, $RS_1$ and $RS_2$, this flip-flop itself receiving the output signal of the NAND gate $P_0$ at a first input, and the output signal of the NAND gate $P_1$ at a second input;

A third input which receives the signal $U_1$.

The output of this NAND gate $P_1$ with three inputs is linked, at the same time, to the input of the memory cell $MU_1$ and to a first input of a NAND gate $P''$ located in the end memory $M_2$ and provided with two other inputs, one linked to the output of the NAND gate $P_0$ and the other to the output of the NAND gate $RS_1$.

The end cells thus comprise an ancillary memory ($RS_1/RS_2$ for one of the ends, and $RV_1/RV_2$ for the other end), the output $RS_1$ (or $RV_1$) of which resets the logic gate $P_1$ (or $P_5$) at "1" and the gate $\overline{U}_1$ (or $D_1$) at "0", thus transmitting a standardized clock sign, with a duration of $3\tau$, to the cell $MU_{k-1}$ (or $MD_{k-1}$) regardless of the duty factor of the input clock R (or V).

FIG. 6 represents the device of FIG. 2 associated with a special analog summation circuit by which the utmost use can be made of its performance characteristics.

The device of FIG. 2 is depicted very schematically by stages which are cascade connected and re-looped with one another, each stage representing one memory cell with an output U or D.

To have the value of the phase shift in analog form, the following operation must be performed:

$$\Delta = \frac{1}{k_d} \sum_{0}^{k} (U_n - D_n)$$

where $k_d=V_L/2$, $V_L$ being the amplitude of the signals of the logic used to make the detector. If a differential amplifier of unit gain were used to make the summation of the $U_n$ and $D_n$, the saturation of the latter would restrict the number of stages k of the detector. For high values of k, it would then be necessary to diminish the gain, but the detection slope would then diminish in the same proportions, thus limiting the performance of the phase-lock loop using a detector of this type, and the operation would also be hampered by the noise of the amplifier.

According to the invention, for high values of k, the solution consists in using an operational amplifier A which is mounted not as a summator, but as an intergrator, making it possible to perform a current summation of the outputs $U_n D_n$ and, hence, not to be limited by the voltage saturation of the amplifier (for it is the sum of the currents $I_n=U_n/R_2$ which charges the capacitor of the integrator, where $R_2$ designates the resistor inserted between the output of each of the stages and one of the $\pm$ inputs of the operational amplifier (A) and at the same time making it possible to perform the loop transfer function H(P), with the output of the operational amplifier A mounted as an integrator then directly driving the command of the voltage-controlled oscillator of this loop.

The decoding circuit can also be made by assigning a gain $\alpha>1$ to the stages of the rank $k>1$, by connecting, to these stages, resistors with a value of $R_2/\alpha$, as depicted in FIG. 7a. The corresponding output characteristic signal $U_s=f(\phi)$, depicted in FIG. 7b, shows that the slope $K_d$ is unchanged during the interval $-2\pi$, $+2\pi$, and that it is multiplied by $\alpha$ for $|\phi|>2\pi$. The dynamic performance values of a phase loop provided with a detector of this type are greatly enhanced as can be seen in the following table, which can be used to compare the dynamic performance values of a phase loop fitted with a phase and frequency detector according to the prior art, working in the interval $\pm 2\pi(D.P.F.\pm 2\pi)$ at the dynamic performance values of a phase looped provided with a phase and frequency detector according to the invention, working in the interval ±2(K+1)π, and with more than a coefficient α assigned to it.

Comparative dynamic performance values of a phase loop with an inherent angular frequency of $w_n$

|  | D.P.F. ± $2\pi$ | D.P.F ± 2(K + 1) π |
|---|---|---|
| Capturing band | $\omega_c$ | $(1 + K\alpha)\omega_c$ |
| Frequency gradient | $\omega_n^2$ | $(1 + K\alpha)\omega_n^2$ |
| Frequency alignment | $\omega_n/2^2$ | $[1 + \alpha(K - \frac{1}{2})] \omega_n^2$ |

The present invention also pertains to a phase loop locking detection circuit incorporating a phase and frequency detector according to the invention.

For it may be necessary to know the moment at which a loop of this type is locked in for example, in order to control another device at that very same moment.

For this, there are known methods in the prior art, as shall be depicted in FIG. 8a, to make an OR-exclusive gate between the signals R and V, thus giving a signal S as depicted in the timing diagram of FIG. 8b, and then to filter the signal S thus obtained, thus giving a signal $V_S(\phi)$ as represented also in FIG. 8b, and then to make a comparison with a threshold lower than $V_0$, thus giving a signal B, as depicted also in FIG. 8b.

It can be seen in these figures that, with a circuit of this type, there is ambuguity in the knowledge of the moment at which the loop is locked in (i.e. the moment when $\phi$ becomes equal to 0), for the signal $V_S(\phi)$ is cancelled for all values of $\phi$ which are multiples of $2\pi$.

As depicted in the FIG. 9a, with an OR-exclusive circuit OE connected to the outputs of the same nature, $U_0$ and $D_0$, of the two central memory cells $MU_0$ and $MD_0$ of the phase and frequency detector according to the invention, an ambiguity of this type is eliminated since, for $|\phi| > 2\pi$, these two outputs are in opposite logic states by nature. This appears in FIG. 9b depicting the signals $V_S(\phi)$ and $B(\phi)$ obtained at the output of the filtering circuit R-C, which is then intended to filter the short angular frequencies with a duration $\tau$ of the outputs $U_0$ and $D_0$, and at the output of the comparator respectively. The threshold signal is, moreover, formed by filtering the signal Q equal to the complement of the output signal $\bar{Q}$ of the OR-exclusive gate.

The above description and operation relate to the diagram of FIG. 2 in which the circuit which is the object of the invention is made by means of NAND gates. The same diagram can be made by means of NOR gates as depicted in FIG. 10. The principle is the same. The only difference lies in the fact that the device is sensitive to the rising edges (and no longer to the descending edges) of the clocks R and V, and in the fact that outputs D or U are the complements of the same outputs in the preceding diagram using the NAND gates.

What is claimed is:

1. Phase and frequency detector, receiving two logic input signals, R and V, comprising a set of 2k+2 memory cells ($MU_k$ to $MU_0$, and $MD_0$ to $MD_k$) which are cascade connected and linked in twos by 2k+1 control cells ($CUD_0$, $CU_{01}$ to $CU_{k-1,k}$, $CD_{01}$ to $CD_{k-1,k}$) capable, firstly, of transferring the information, contained in the changes of state of the signals R and V, from the end memory cells ($MU_k$, $MD_k$), to which they are respectively applied, and by each direction respectively, up to a memory cell $MU_n$ or $MD_n$ (depending on whether the signal R is in advance or is delayed with respect to the signal V), this memory cell then providing square waves, the duty factor of which is proportionate to the instantaneous phase shift $D\phi$ between the signals R and V, when $(2\pi-1)n < |D\phi| < 2n\pi$, and secondly, of keeping the memory cells $MU_{n+1}$ to $MU_k$ and $MD_0$ to $MD_k$ in their initial logic state, and cells $MU_0$ to $MU_{n-1}$ in an opposite logic state, or memory cells $MD_{n+1}$ to $MD_k$ and $MU_0$ to $MU_k$ in their initial logic state, and cells $MD_0$ to $MD_{n-1}$ in an opposite logic state, depending on whether the signal R is ahead or delayed with respect to the signal V.

2. Detector according to claim 1, wherein the memory cells comprise "RS" type logic flip-flop circuits.

3. Detector according to claim 1 wherein the control cells comprise logic gates of the NAND type.

4. Detector according to claim 1 wherein the control cells comprise logic gates of the NOR type.

5. Detector according to claim 3 wherein the logic gate forming the central control cell has its inputs linked to complementary outputs of the memory cells between which they are set.

6. Detector according to claim 3 wherein the logic gates forming the intermediate control cells have an input connected to the true output of one memory cell and an input connected to a complementary output of another memory cell.

7. Detector according to claim 1 wherein the end memory and control cells further comprise means for transforming the square waves of the signals R and V into short angular frequencies.

8. Detector according to claim 1 wherein the outputs of the various memory cells are current summated.

9. Detector according to one of the claims 1 to 7, wherein the outputs of the various memory cells are current summated with a weighting for stages with a rank of k>1.

10. The phase and frequency detector of claim 1 wherein said phase and frequency detector is incorporated in a phase-lock loop.

11. The phase and frequency detector of claim 10 wherein said phase-lock loop includes a circuit to detect locking of the loop, said circuit to detect locking including an exclusive-OR circuit connected to the outputs of the central memory cells.

* * * * *